(12) United States Patent
Kanamura

(10) Patent No.: US 6,358,835 B1
(45) Date of Patent: Mar. 19, 2002

(54) METHOD OF MANUFACTURING A SEMICONDUCTOR DEVICE

(75) Inventor: Ryuichi Kanamura, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/501,519

(22) Filed: Feb. 9, 2000

(30) Foreign Application Priority Data

Feb. 10, 1999 (JP) ............................................. 11-032253

(51) Int. Cl.[7] ........................................ H01L 21/4763
(52) U.S. Cl. ...................................... 438/618; 438/705
(58) Field of Search .............................. 438/618, 622, 438/625, 700, 704–706, 723, 725

(56) References Cited

U.S. PATENT DOCUMENTS

| | | | | |
|---|---|---|---|---|
| 5,872,061 A | * | 2/1999 | Lee et al. | 438/705 |
| 5,970,376 A | * | 10/1999 | Chen | 438/637 |
| 6,007,733 A | * | 12/1999 | Jang et al. | 438/705 |
| 6,019,906 A | * | 2/2000 | Jang et al. | 261/2 |

* cited by examiner

Primary Examiner—David Nelms
Assistant Examiner—Dung A Le
(74) Attorney, Agent, or Firm—Sonnenschein, Nath & Rosenthal

(57) ABSTRACT

During liquid chemical cleaning treatment, leaching of buried plugs occurs from a portion where the buried plugs are exposed locally to result in increase of resistance, lowering of electric conduction yield, lowering of device yield and deterioration of reliability. In a method of manufacturing a semiconductor device by forming upper layer interconnections on buried plugs formed in an interlayer insulating film, the upper layer interconnections are formed by patterning using etching and then plasma processing using an oxygen series gas with addition of a fluorine series gas is applied to the surface of the buried plugs formed being extended out of the upper layer interconnections, before removing the resist film 19 used as an etching mask at least by the organic stripping liquid, thereby forming a protection film on the surface of the buried plugs.

6 Claims, 3 Drawing Sheets

METHOD OF MANUFACTURING A SEMICONDUCTOR DEVICE

RELATED APPLICATION DATA

The present application claims priority to Japanese Application No. P11-032253 filed Feb. 10, 1999 which application is incorporated herein by reference to the extent permitted by law.

BACKGROUND OF THE INVENTION

1. Field of the Invention

The present invention relates to a method of manufacturing a semiconductor device and more particularly to a method of manufacturing a semiconductor device of forming upper layer interconnections on a buried plugs comprising tungsten.

2. Description of the Related Art

Along with increasing degree of integration and refinement for semiconductor devices, it has become important for the introduction of a so-called borderless structure having no overlapping margin between connection holes and conductor interconnections. Usual conductor interconnections are not formed by a minimum design rule but formed by a design rule while considering overlap to connection holes or misalignment of conductor wires to connection holes above connection steps. Accordingly, as the progress of refinement, the integration degree is restricted by the overlapped portion. Accordingly, it is one of technical subjects for higher integration degree to provide a borderless structure of not deteriorating the device yield and the wiring reliability even if misalignment should occur.

Explanations are to be made for the related art with reference to the manufacturing step chart of FIG. 3. As shown in FIG. 3a, after forming lower layer interconnections 112 on an underlying insulating film 111, an interlayer insulating film 113 is deposited on the underlying insulating film 111 in a state of covering the lower layer interconnections 112 and then the surface is flattened. Subsequently, as shown in FIG. 3b, a resist film 114 having an opening pattern 114 used for fabrication of connection holes is formed on the interlayer insulation film 113. Then, using the resist film 114 as a mask, connection holes 115 in communication with the lower layer interconnections 112 are formed in the interlayer insulating film 113 by anisotropic dry etching.

Subsequently, after removing the resist film 114, as shown in FIG. 3c, reverse sputter cleaning is conducted using, for example, a magnetron sputtering device. Then, an adhesion layer 116 is formed to the inner wall of the connection holes 115 and on the interlayer insulation film 113 and then a tungsten film is formed over the entire surface as a burying metal to the connection holes by 115 by CVD process. Subsequently, an excess tungsten film and the adhesion layer 116 on the interlayer insulation film 113 are removed by using an entire surface etching back method by reactive ion etching, to form buried plugs 117 comprising a tungsten film Then, as shown in FIG. 3d, a metal layer 118 for upper layer interconnections covering the buried plugs 117 is formed on the interlayer insulation film 113, for example, by magnetron sputtering. The metal layer 118 is prepared, for example, by forming, a titanium film formed to 200 nm thickness, a titanium nitride film to 20 nm thickness, an Al-0.5% Cu film to 500 nm thickness, titanium to 5 nm thickness, and then a titanium nitride film to 100 nm thickness successively from the lower side. Then, a resist film 119 as a mask for forming upper layer interconnections is formed by resist coating and lithographic technique.

Then, as shown in FIG. 3e, the metal layer 118 is etched by anisotropic dry etching using the resist film 119 as an etching mask, to form upper layer interconnections 120. As the condition for the anisotropic dry etching, boron trichloride ($BCl_3$) (100 sccm) and chlorine ($Cl_2$) (150 sccm) are used for the etching gas, and etching is conducted while at 40% overetching relative to just etching setting the pressure for the etching atmosphere at 1 Pa, the microwave power at 400 mA and the high frequency RF at 110 W.

Then, the resist film 119 is removed by an ashing treatment and a liquid chemical cleaning treatment. The ashing treatment is conducted by using a parallel plate type reactive ion etching apparatus, and using oxygen ($O_2$) (flowrate: 3750 sccm) as the processing gas, while setting the process temperature at 250° C., the pressure for the ashing atmosphere at 150 Pa, RF power at 900 W and the ashing time for 60 sec. The liquid chemical cleaning treatment comprises immersion in an amine type solvent for 15 min and cleaning by running water for 10 min.

However, in a case where the buried plugs are locally exposed upon liquid chemical treatment, electrochemical reaction occurs during the amine type organic solvent treatment under the effect of charges accumulated in aluminum during wiring fabrication to form buried plug 117b leaching tungsten. This is illustrated in FIG. 4. In the thus formed semiconductor device, since through hole (connection hole) resistance increases locally and electric conduction yield relative to the lower layer interconnections is lowered, the device yield is lowered. Further, even when tungsten leaches to such an extent as not causing conduction failure, it may be a worry for the degradation of reliability between the upper layer interconnections and the buried plugs (by electromigration, stress migration and the like).

SUMMARY OF THE INVENTION

The present invention provides a method of manufacturing a semiconductor device for overcoming the foregoing problems. A first manufacturing method for a semiconductor device comprises the steps of: forming upper layer interconnections on buried plugs formed in an insulating film, wherein the upper layer interconnections are patterned by etching, a surface of the buried plugs being partially exposed with no upper layer interconnections formed thereon; and plasma processing using an oxygen series gas with addition of a fluorine series gas is applied to the exposed surface of the buried plugs at least before removing a resist film used as an etching mask with an organic stripping liquid, thereby forming a protection film on the surface of the buried plugs.

According to the first manufacturing method, since the plasma processing is applied to the exposed surface of buried plugs by using an oxygen series gas incorporated with the fluorine series gas at least before removing the resist film used as the etching mask with the organic stripping liquid thereby forming the protection film on the surface of the buried plugs, the surface of the buried plugs is covered with the protection film even if the resist film is removed thereafter by the organic stripping liquid, the buried plugs are not leached out by electrochemical reaction with the organic stripping liquid. Accordingly, the present invention provides a method of forming interconnections for highly integrated semiconductor devices having stable device yield and high reliability.

A second manufacturing method of the present invention comprises a method of manufacturing a semiconductor device of forming upper layer interconnections on buried plugs formed in an insulating film, wherein the upper layer interconnections are patterned and formed by etching and plasma processing using a gas mainly comprising an inert gas is applied to the surface of the buried plugs formed being extended out of the upper layer interconnections at least before removing a resist film used as an etching mask with an organic stripping liquid, thereby eliminating static charges accumulated on the upper layer interconnections.

In the second manufacturing method, since the plasma processing is applied to the surface of the buried plugs formed being extended out of the upper layer interconnections by using a gas mainly comprising an inert gas at least before eliminating the resist film used as the etching mask with the organic stripping liquid, electrostatic charges accumulated on the upper layer interconnections are removed. Accordingly, even if the resist film is removed by the organic stripping liquid, electrochemical reaction with the organic stripping liquid less occurs and leaching of the buried plugs is suppressed. Accordingly, the present invention provides a method of forming interconnections for highly integrated semiconductor devices having stable device yield and high reliability.

DETAILED DESCRIPTION OF THE PREFERRED EMBODIMENTS

Explanations are to be made for a preferred embodiment according to the first production method of the present invention with reference to the production step charts shown in FIGS. 1a to 1g.

Figure 1A:
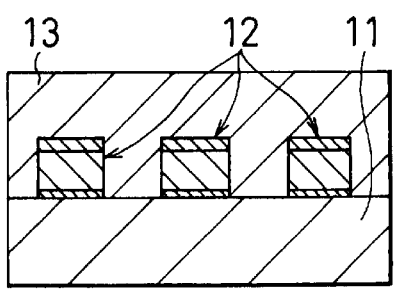
FIGS. 1a to 1g are production step charts showing an embodiment according to a first manufacturing method of the present invention.

As shown in FIG. 1a, lower layer interconnections 12 are formed on an underlying insulating film 11. A method of forming the lower layer interconnections 12 is to be explained below.

At first, a wiring layer constituting the lower layer interconnections 12 is formed by magnetron sputtering.

As an example, the wiring layer is formed by forming at first titanium (Ti) to 20 nm thickness as the lower layer. As an example of the film forming condition, argon is used as a processing gas, while setting the flowrate of the gas at 35 sccm, the pressure for the film forming atmosphere at 0.52 Pa, the microwave power to 2 kW and a substrate temperature at 300° C.

Then, a titanium nitride (TiN) is formed to a thickness of 20 nm. As an example for the film forming condition, nitrogen (flowrate: 42 sccm) and argon (flow rate: 21 sccm) are used as a processing gas while setting the pressure for the film forming atmosphere at 0.78 Pa, the microwave power at 6 kW and the substrate temperature at 300° C.

Then, Al-0.5% Cu is formed to a thickness of 500 nm. As an example for the film forming condition, argon (flow rate: 65 sccm) is used as a processing gas while setting the pressure for the film forming atmosphere at 0.52 Pa, the microwave power at 15 kW and the substrate temperature at 30° C.

Then, titanium (Ti) is formed to a thickness of 5 nm. As an example for the film forming condition, argon (at a flow rate of 35 sccm) is used as the processing gas while setting the pressure for the film forming atmosphere at 0.52 Pa, the microwave power at 2 kW and the substrate temperature at 300° C.

Finally, titanium nitride (TiN) is formed to a thickness of 100nm. As an example for the film forming condition, nitrogen (flowrate: 42 sccm) and argon (flow rate: 21 sccm) are used as a processing gas, while setting the pressure for the film forming atmosphere at 0.78 Pa, the microwave power at 6 kW and the substrate temperature at 300° C.

After thus forming the wiring layer, a resist film (not illustrated) used for forming the lower layer interconnections 12 is formed on the wiring layer by known resist coating and lithographic technique. Then, the lower layer interconnections 12 are formed by anisotropically dry etching the wiring layer using the resist film as an etching mask.

In the anisotropic dry etching described above, boron trichloride (flowrate: 100 ccm) and chlorine (flowrate: 150 sccm) are used as an etching gas and etching is conducted while setting, as the etching condition, the pressure for the etching atmosphere at 1 Pa, the microwave power at 400 mA and the high frequency RF at 110 W, with 40% overetching relative to just etching.

Then, an interlayer insulating film 13 covering the lower layer interconnections 12 is deposited on the underlying insulating film 11.

Figure 1B:
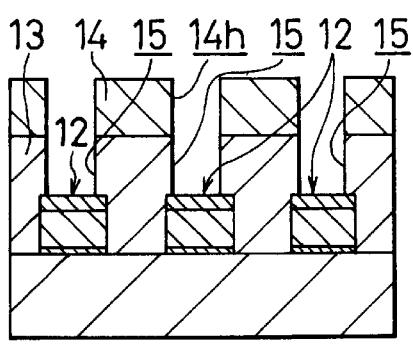

Subsequently, as shown in FIG. 1b, a resist film 14 having openings 14 for fabrication of connection holes in the interlayer insulating film 13 is formed by known resist coating and lithographic technique. Further, connection holes 15 in communication with the lower layer interconnections 12 are formed to the inter layer insulating film 13 by anisotropically dry etching the interlayer insulating film 13 using the resist film 14 as an etching mask.

In the anisotropic dry etching , carbon monoxide (flowrate; 100 ccm) and octafluorocyclobutane ($C_4F_8$) (flowrate: 7 sccm) and argon (flowrate: 200 sccm) are used are an etching gas while setting, as the etching condition, the pressure for etching atmosphere at 2 Pa, the high frequency RF at 1450 W with 30% overetching relative to just etching.

Figure 1C:
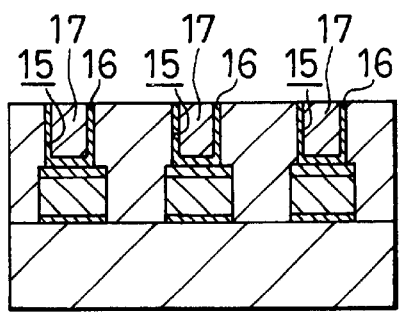

Subsequently, the resist film 14 is removed. Then, as shown in FIG. 1c, an adhesion layer 16 is formed over the entire surface by reverse sputter cleaning using, for example, a magnetron sputtering device and, further, a tungsten film as a burying method is formed over the entire surface, for example, by a thermal CVD process. Then, the entire surface etching back is applied by reactive ion etching to form buried plugs 17 by way of the adhesion layer 16 at the inside of the connection holes 15.

An example of conditions for forming the buried plugs 17 is shown below. At first, RF etching is conducted to etch the surface of the formed film to about 20 nm. As an example of the etching condition, argon (flowrate: 5 sccm) is used as an etching gas, while setting the pressure for the etching atmosphere at 0.52 Pa and RF power at 500 W. The substrate is not heated.

Then, the adhesion layer 16 is formed by forming titanium nitride (TiN) to 30 nm thickness by magnetron sputtering. As an example of the condition for film formation, nitrogen (flowrate: 135 sccm) and argon (flowrate: 15 sccm) are used as a processing gas while setting the pressure for the film forming atmosphere at 0.78 Pa, the microwave power at 6.5 kW and the substrate temperature at 150° C.

Then, a blanket tungsten film is formed, for example, to 600 nm thickness by a thermal CVD process. As an example of a film forming condition, tungsten hexafluoride (flowrate: 40 sccm), hydrogen (flowrate: 400 sccm) and argon flowrate: 2250 sccm) are used as the processing gas while setting the pressure for the film forming atmosphere at 10.7 kPa, and the temperature for the film forming atmosphere at 450° C.

Then, fabrication for forming the buried plugs 17 is applied by anisotropic dry etching. At first, tungsten is etched at the first step. As an example of the etching condition, sulfur hexafluoride (flowrate: 110 sccm), argon (flowrate: 90 sccm) and helium (flowrate: 5 sccm) are used as the etching gas while setting the pressure for the etching atmosphere at 45.5 Pa and the high frequency RF at 275 W.

Then, the adhesion layer 16 comprising the titanium nitride film is etched by etching in the second step. As an example for the etching condition, argon (flowrate: 75 sccm) and chlorine (flowrate: 5 sccm) are used as the etching gas while setting the pressure for the etching atmosphere at 6.5 Pa and the high frequency RF at 250 W.

Then, etching at the third step is conducted to etch tungsten and, further, overetching is conducted. As an example for the etching condition, sulfur hexafluoride (flowrate: 20 sccm), argon (flowrate: 10 sccm) and helium (flowrate: 10 sccm) are used as the etching gas while setting the pressure for the etching atmosphere at 32.5 Pa, and the high frequency RF at 70 W. In this way, buried plugs 17 comprising tungsten are formed by way of the adhesion layer 16 to the inside of the connection holes (15).

Figure 1D:
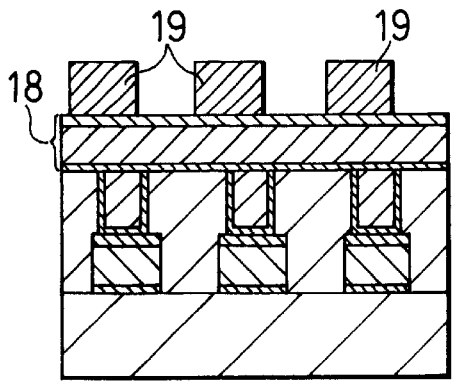

Then, as shown in FIG. 1d, a wiring layer 18 for upper layer interconnections is formed over the entire surface and in a state of covering the buried plugs 17 on the interlayer insulating film, for example, by magnetron sputtering.

For the wiring layer 18, for example, titanium (Ti) is at first formed to 20 nm thickness as the lower layer. As an example for the film forming condition, argon is used as a processing gas while setting the flowrate to 35 sccm, the pressure for the film forming atmosphere at 0.52 Pa, the microwave power at 2 kW and the substrate temperature at 300° C.

Then, titanium nitride (TiN) is formed to 20 nm thickness. As an example for the film forming condition, nitrogen (flowrate: 42 sccm) and argon (flowrate: 21 sccm) are used as the processing gas while setting the pressure for the film forming atmosphere at 0.78 Pa, the microwave power at 6 kW and the substrate temperature at 300° C.

Then, Al-0.5% Cu is formed to 500 nm thickness. As an example for the film forming condition, argon (flowrate: 65 sccm) is used as the processing gas while setting the pressure for the film forming atmosphere at 0.52 Pa, the microwave power at 15 kW and the substrate temperature at 300° C.

Then, titanium nitride (TiN) is formed to 5 nm thickness. As an example for the film forming condition, argon is used at a flowrate of 35 sccm as the processing gas while setting the pressure for the film forming atmosphere at 0.52 Pa, the microwave power at 2 kW and the substrate temperature at 300° C.

Finally, titanium nitride (TiN) is formed to 100 nm thickness. As an example for the film forming condition, nitrogen (flowrate: 42 sccm) and argon (flowrate: 21 sccm) are used as the processing gas while setting the pressure for the film forming atmosphere at 0.78 Pa, the microwave power at 6 kW and substrate temperature at 300° C.

After thus forming the wiring layer 18, a resist film 19 used for forming upper layer interconnections is formed on the wiring layer 18 formed on the resist coating and lithographic technique.

Figure 1E:
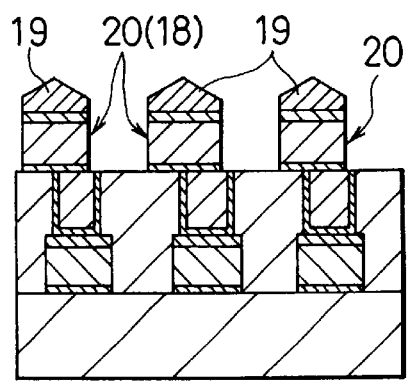

Then, as shown in FIG. 1e, upper layer interconnections 20 are formed by anisotropically dry etching the wiring layer 18 by using the resist film 10 as an etching mask.

In the anisotropic dry etching described above, boron trichloride (flowrate: 100 ccm) and chlorine (flowrate: 150 sccm) are used as an etching gas while setting the pressure for the etching atmosphere at 1 Pa, the microwave power at 400 mA and the high frequency RF at 110 W with 40% overetching relative to just etching.

Figure 1F:
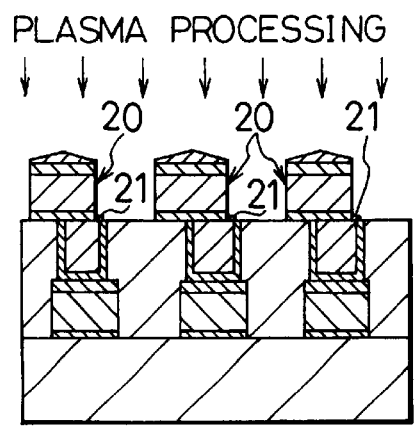

Subsequently, as shown in FIG. 1f, plasma processing is conducted by using a fluorine (F) series gas formed by adding, for example, tetrafluoromethane ($CF_4$) to an oxygen gas, and an organic solvent resistant protection film 21 is formed to a portion of the buried plugs 17 comprising tungsten exposed from the upper layer interconnections 20 simultaneously with resist ashing processing.

In the plasma processing, a parallel plate type reactive ion etching apparatus is used, and oxygen ($O_2$) (flowrate 3750 sccm) and tetrafluoromethane ($CF_4$) (flowrate: 0.5 sccm to 10 sccm, preferably, at 2 sccm), while setting the process temperature at 250° C., the pressure for the processing atmosphere at 150 Pa, the RF power at 900 W and the processing time for 60 sec.

In the plasma processing described above, since the processing gas contains oxygen, the resist film 19 is ashfied.

Then, the resist film 19 is completely removed by a liquid chemical cleaning treatment. The liquid chemical cleaning treatment comprises, for example, immersion in an amine type organic solvent for 15 min and washing with running water for 10 min.

Figure 1G:
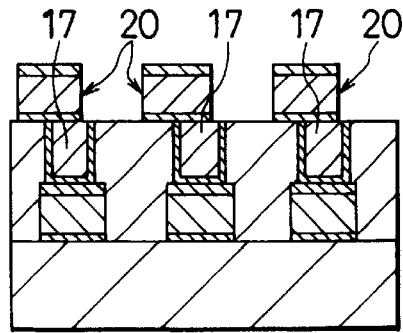

As a result, as shown in FIG. 1g, the upper layer interconnections 20 connected on the buried plugs 17 are formed with leaching of the buried plugs 17 comprising tungsten.

In the multi-layered interconnections for the semiconductor device formed by the manufacturing method described above, formation of buried plugs causing tungsten to leach upon treatment with the amine type organic solvent is suppressed by the protection film 21 formed by the plasma processing. Accordingly, the yield for electric conduction with the lower layer interconnections 12 and the device yield are also favorable. The lower layer interconnections 12 and the upper layer interconnections 20 may be of a structure mainly comprising aluminum series alloys, copper (Cu) or copper series alloys in addition to those described above and the barrier metal may be made of a single titanium layer or a single titanium nitride layer, or a laminate structure made of other titanium series alloys, tungsten, tungsten series alloys, tantalum aluminum or materials selected therefrom.

Further, the buried plugs 17 comprising tungsten may also be formed by using chemical mechanical polishing instead of etching back.

Further, it is necessary to set the flowrate of tetrafluoromethane ($CF_4$) added in the plasma processing to such a flowrate as not worsening the shape considering the reduction of the side etching of the barrier metal and, for example, it is preferably within a range from 0.5 sccm to 10 sccm. Instead of tetrafluoromethane ($CF_4$), it is also possible to use a fluoric gas such as octafluorobutene ($C_4F_8$), trifluoromethane ($CHF_3$) or sulfur hexafluoride ($SF_6$), and the added gas is not restricted to oxygen and it is also possible to add, for example, nitrogen, hydrogen and forming gas.

Then, explanations are to be made for a preferred embodiment according to the second manufacturing method of the present invention by way of the production step charts.

Figure 2A:
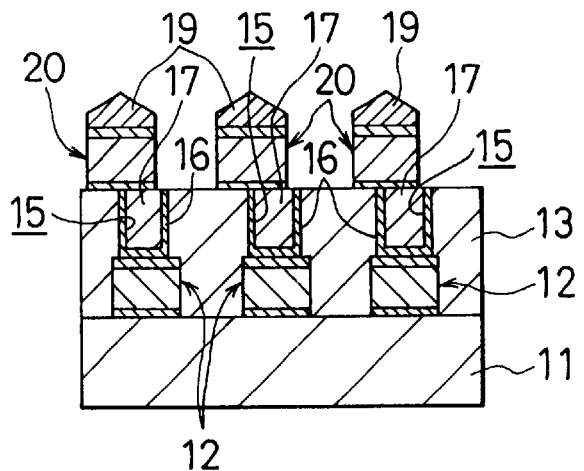
FIGS. 2a to 2c are production step charts showing an embodiment according to a second manufacturing method of the present invention.

In the same manner as explained with reference to FIGS. 1a to 1e, lower layer interconnections 12 are formed on an underlying insulating film 11 as shown in FIG. 2a. The lower layer interconnections 12 were identical with those in the first embodiment described above. That is, they comprises a titanium (Ti) film, a titanium nitride (TiN) film, an Al-0.5% Cu film and a titanium (Ti) film, a titanium nitride (TiN) film successively. Further, an interlayer insulating film 13 for covering the lower layer interconnections 12 is deposited on the underlying insulating film 11. Then, connection holes 15 in communication with the lower layer interconnections 12 are formed in the interlayer insulation film 13. Then, buried plugs 17 comprising tungsten are formed to the inside of the connection holes 15 by way of an adhesion layer 16.

Subsequently, after forming a wiring layer 18 for the upper layer interconnections over the entire surface on the interlayer insulating film and in a state of covering the buried plugs 17, a resist film 19 for forming the upper layer interconnections is formed on the wiring layer 18. Then, the upper layer interconnections 20 are formed by anisotropically dry etching the wiring layer 18 using the resist film 19 as an etching mask. The upper layer interconnections 20 comprises a titanium (Ti) film, a titanium nitride (TiN) film, an Al-0.5% Cu film, a titanium (Ti) film and a titanium nitride (TiN) film laminated successively from the lower side.

Figure 2B:
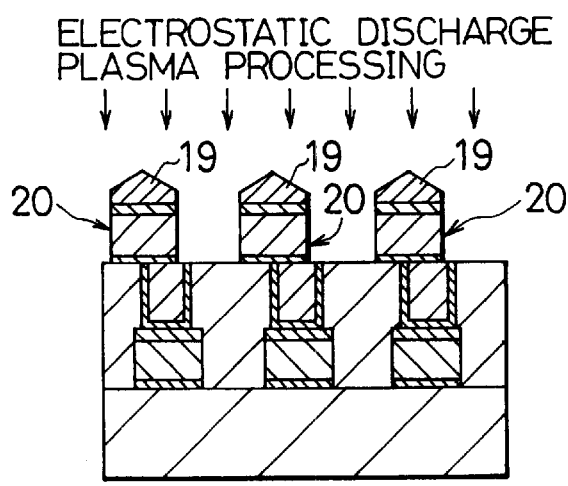

Subsequently, as shown in FIG. 2b, static charges accumulated on the upper layer interconnections 20 upon fabrication of the upper layer interconnections 20 are eliminated by applying electrostatic discharge plasma processing or destaticizing plasma processing as shown in FIG. 2b.

The plasma processing for eliminating static charges is conducted by using, for example, a parallel plate type reactive ion etching device, and using argon (flowrate: 800 sccm) and oxygen (flowrate: 3750 sccm) as the processing gas while setting the processing temperature at 40° C., the pressure for the processing atmosphere at 200 Pa, the RF power at 400 W and the processing time for 60 sec.

Then, the resist film 19 is removed by an ashing treatment and a liquid chemical cleaning treatment.

The ashing treatment is applied, for example, by using a parallel plate type reactive ion etching device and using oxygen (flowrate: 3750 sccm) as the processing gas while setting the processing temperature at 250° C., the pressure for the processing atmosphere at 150 Pa, the RF power at 900 W and the processing time for 60 sec.

The liquid chemical cleaning treatment comprises immersion in an amine type organic solvent for 15 min and washing with running water for 10 min.

Figure 2C:
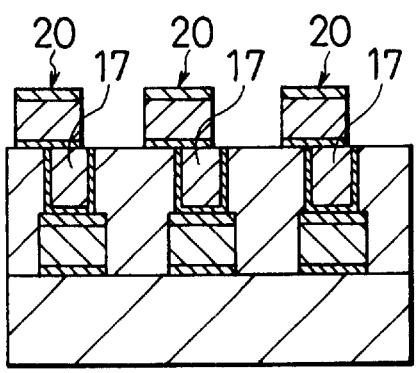
Figure 3A:
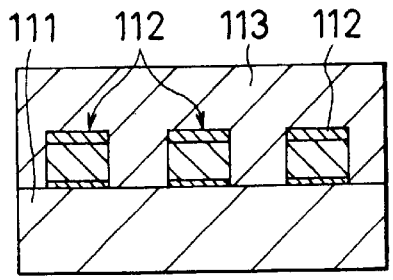
FIGS. 3a to 3e are production step charts for explaining the related art.
Figure 3B:
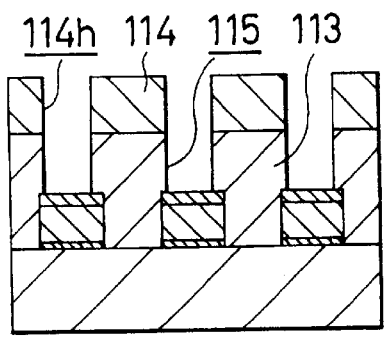
Figure 3C:
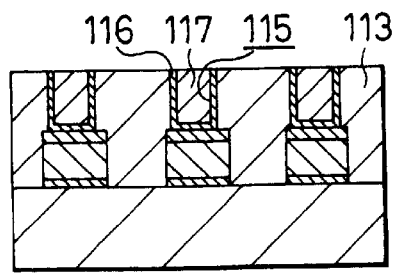
Figure 3D:
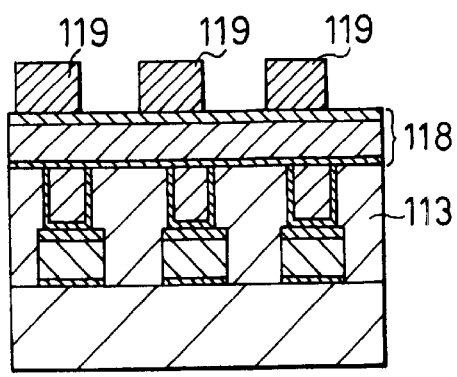
Figure 3E:
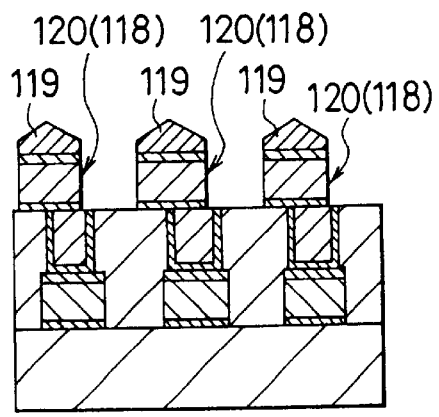
Figure 4:
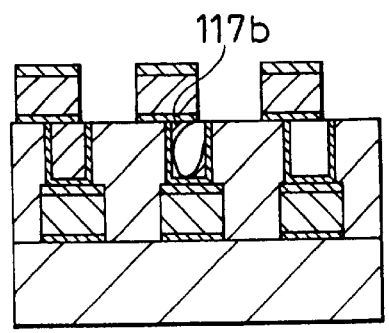
FIG. 4 is a view for explaining the problem in the related art.

As a result, as shown in FIG. 2c, an upper layer interconnections 20 connected on the buried plugs 17 are formed without leaching the buried plugs 17 comprising tungsten.

In the multi-layered interconnections for the semiconductor device formed by the manufacturing method as descried above, since static charges accumulated on the upper layer interconnections 20 are eliminated, the buried plugs 17 comprising tungsten causing electrochemical reaction by the amine type organic solvent treatment is suppressed from leaching. Accordingly, the yield for electric conduction with the lower layer interconnections 12 and the device yield are also improved. The lower layer interconnections 12 and the upper layer interconnections 20 may of a structure mainly comprising an aluminum series alloys, copper (Cu) and copper series alloys in addition to those described above and the barrier metal may be made of a single titanium layer, a single titanium nitride layer, or a laminate structure made of other titanium series alloys, tungsten, tungsten series alloy, tantalum aluminum or materials selected therefrom.

Further, a fluoric gas may be added to the processing gas upon ashing treatment by oxygen plasmas. Tetrafluoromethane ($CF_4$) explained in the first embodiment may be added. Alternatively, it is also possible to use a fluoric gas such as octafluorobutene ($C_4F_8$), trifluoromethane ($CHF_3$) or sulfur hexafluoride ($SF_6$). Further, the gas for addition is not restricted to oxygen and, for example, they may be used being added to nitrogen, hydrogen, forming gas or the like.

Further, it is necessary that the flowrate of tetrafluoromethane ($CF_4$) added in the plasma processing is set to such a flowrate as not worsening the shape while also considering the reduction of the side etching of the barrier metal and, it is preferably within a range, for example, from 0.5 sccm to 10 sccm.

As has been explained above, according to the first manufacturing method of the present invention, since the plasma processing using the oxygen series gas with addition of the fluorine series gas is applied to the surface of the buried plugs formed being extended out of the upper layer interconnections before eliminating the resist film by the organic stripping liquid thereby forming the protection film on the surface of the buried plugs, the buried plugs are not leached by the organic stripping liquid subsequently.

According to the second manufacturing method, since the plasma processing using the gas mainly comprising the inert gas is conducted before eliminating the resist film by the organic stripping liquid, static charges accumulated on the upper layer interconnections are eliminated, so that buried plugs can be suppressed from leaching upon stripping the resist by the organic stripping liquid.

Accordingly, even when misalignment for the pattern comprising the resist film should occur by the reduction of the circuit area or even when the upper layer interconnections to be connected with the buried plugs and having a width narrower than that of the buried plug are formed, since selective leaching of the buried plugs can be suppressed, it is possible to provide a semiconductor device of high performance, high reliability with high yield having favorable contact characteristics and conduction yield.

What is claimed is:

1. A method of manufacturing a semiconductor device, the method comprising the steps of:

forming upper layer interconnections on buried plugs formed in an insulating film, wherein the upper layer interconnections are patterned and formed by etching, a surface of the buried plugs being partially exposed with no upper layer interconnections formed thereon; and applying a plasma processing using an oxygen series gas with addition of a fluorine series gas to the exposed surface of the buried plugs at least before removing a resist film used as an etching mask with an organic stripping liquid, thereby forming a protection film on the surface of the buried plugs.

2. The method of manufacturing a semiconductor according to claim 1 wherein said upper layer includes at least one member of the group consisting of aluminum series alloy, copper and copper series alloy.

3. The method of manufacturing a semiconductor according to claim 1 wherein said fluorine series gas includes at least one member of the group consisting of $CF_4$, $C_4F_8$, $CHF_3$ and $SF_6$.

4. A method of manufacturing a semiconductor device, the method comprising the steps of:

forming upper layer interconnections on buried plugs formed in an insulating film, wherein the upper layer interconnections are patterned and formed by etching, a surface of the buried plugs being partially exposed with no upper layer interconnections formed thereon; and applying a plasma processing using a gas mainly comprising an inert gas to the exposed surface of the buried plugs at least before removing a resist film used as an etching mask with an organic stripping liquid, thereby eliminating static charges accumulated on the upper layer interconnections.

5. The method of manufacturing a semiconductor according to claim 4 wherein said upper layer includes at least one member of the group consisting of aluminum series alloy, copper and copper series alloy.

6. The method of manufacturing a semiconductor according to claim 4, wherein said inert gas comprises at least one member of the group consisting of $CF_4$, $C_4F_8$, $CHF_3$ and $SF_6$.

* * * * *